US006421815B1

(12) United States Patent
Seawright

(10) Patent No.: US 6,421,815 B1
(45) Date of Patent: *Jul. 16, 2002

(54) METHOD AND APPARATUS FOR OPTIMIZED PARTITIONING OF FINITE STATE MACHINES SYNTHESIZED FROM HIERARCHICAL HIGH-LEVEL DESCRIPTIONS

(75) Inventor: James Andrew Garrard Seawright, Mountain View, CA (US)

(73) Assignee: Synopsys, Inc., Mountain View, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/037,553

(22) Filed: Mar. 9, 1998

Related U.S. Application Data

(60) Provisional application No. 60/072,381, filed on Jan. 9, 1998.

(51) Int. Cl.$^7$ .................... G06F 17/50; G06F 17/10; G06F 7/60
(52) U.S. Cl. .................. 716/7; 716/18; 716/21; 717/9
(58) Field of Search .................. 716/18, 16, 7

(56) References Cited

U.S. PATENT DOCUMENTS

| 5,140,526 A | * | 8/1992 | McDermith et al. ........ 364/488 |
| 5,469,367 A | * | 11/1995 | Puri et al. .................... 364/489 |
| 5,513,122 A | * | 4/1996 | Cheng et al. ................ 364/489 |
| 5,537,580 A | * | 7/1996 | Giomi et al. ................ 395/500 |
| 5,539,680 A | * | 7/1996 | Palnitkar et al. ............. 364/578 |
| 5,680,332 A | * | 10/1997 | Raimi et al. ................. 364/578 |
| 5,774,370 A | * | 6/1998 | Giomi ......................... 364/489 |
| 5,920,711 A | * | 7/1999 | Seawright et al. ........... 395/500 |
| 6,035,109 A | * | 3/2000 | Ashar et al. ............. 395/500.04 |

OTHER PUBLICATIONS

Gerard Berry and Georges Gonthier, "the Esterel synchronous programming language: design, semantics, implementation", in Science of Computer Programming, vol. 19 (No. 2), pp. 87–152, Nov. 1992.

Olivier Coudert, Christian Berthet and Jean Christophe Madre, "Verification of Synchronous Sequential Machines Based on Symbolic Execution", in Automatic Verification Methods for Finite State Systems, International Workshop, Grenoble France, vol. 407, Lecture Notes in Computer Science, Springer Verlag, pp. 365–373, Jun. 1989.

(List continued on next page.)

*Primary Examiner*—Matthew Smith
*Assistant Examiner*—A. M. Thompson
(74) *Attorney, Agent, or Firm*—Jonathan T. Kaplan; Howrey Simon Arnold & White, LLP

(57) ABSTRACT

Finite state machines (FSMs) are synthesized from hierarchical high-level descriptions and optimized. Partitions of the FSM are selected by scanning the nodes of the hierarchical description and assigning to each suitable node a metric based upon the reachability function of the FSM. The metric is an indicator of the desirability of using the partition of the FSM, corresponding to the node, as a region of the FSM upon which to apply FSM optimization techniques. Based upon the metric, certain partitions are selected for optimization. Optimization of a partition can include the steps of converting the partition to a state graph, state graph minimization and conversion back to an FSM. Any hierarchical high-level language is suitable for the present invention, provided that a correspondence between nodes of the high-level description and partitions of the FSM can be determined. Conversion of an FSM partition for the purposes of optimization is performed with pruning functions also derived from the FSM's reachability function.

19 Claims, 16 Drawing Sheets

```
401.   PartitionedCompile(Highlevel_description top_node, circuit top)
402.   {
403.       R(X) = AnalyzeCircuit(top)
404.       ChoosePartitions(top_node, top, R(X))
405.       foreach partition p designated in top {
406.           c = ExtractSubCircuit (top, p)
407.           g = CreateStateGraph (c, R(X))
408.           g' = MinimizeStateGraph (g)
409.           EncodeStateGraph (g')
410.           c' = StateGraphToCircuit(g')
411.           MergeBackSubCircuit(top, p, c')
412.       }
       }

OVERALL COMPILE PROCESS
```

```
501.   AutoPart(Highlevel_description top_node, circuit top, R(X))
502.   {
503.       CollectData (top_node, R(X))
504.       PickPartitions(top_node)
505.   }
506.
507.   CollectData (node n, R$_p$ (X))
508.   {
509.       R$_{Mn}$ (X$_{Mn}$) = ∃ (X$_i$S ∉ X$_{Mn}$) R$_p$ (X)
510.       num_states$_n$ = num_minterms (R$_{Mn}$ (X$_{Mn}$))
511.       foreach child node c of node n {
512.           CollectData (c, R$_{Mn}$ (X$_{Mn}$))
513.       }
514.   }
515.
516.   PickPartitions (node n)
517.   {
518.       if (num_states$_n$ < MinStates) {
519.           return;
520.       }
521.       if (num_states > MaxStates) {
522.           foreach child node c of node n {
523.               PickPartitions (c)
524.       } else {
525.           MarkPartition (c);
526.           return;
527.       }
528.   }

MAXIMUM STATE THRESHOLD ALGORITHM
```

OTHER PUBLICATIONS

Andrew Crews and Forrest Brewer, "Controller Optimization for Protocol Intensive Applications", proceedings of Euro–Dac 96, Geneva, Switzerland, pp. 140–145, Sep. 1996.

David Harel, "Statecharts: A Visual Formalism For Complex Systems", In Science of Computer Programming, vol. 8 (No. 3), pp. 231–274, Aug. 1987.

Wolfgang Meyer, Andrew Seawright and Fumiya Tada, "Design and Synthesis of Array Structured Telecommunication Processing Applications", proceedings of the $34^{th}$ Design Automation Conference pp. 486–491, Jun. 1997.

Andrew Seawright and Forrest Brewer, "Clairvoyant: A Synthesis System For Production–Based Specification", in the proceedings of IEEE Transactions on VLSI Systems, vol. 2, (No.2), pp. 172–185, Jun. 1994.

Andrew Seawright, Ulrich Holtmann, Wolfgang Meyer, Barry Pangrle, Rob Verbrugghe and Joseph Buck, "A System for Compiling and Debugging Structured Data Processing Controllers", proceedings of Euro–Dac 96, Geneva, Switzerland, pp. 86–91, Sep. 1996.

Ellen Sentovich, Horia Toma, and Gerard Berry, "Latch Optimization in Circuits Generated from High–level Descriptions", in the proceedings of the International Conference on Computer–Aided Design ICCAD96, pp. 428–435, Nov. 1996.

Ellen Sentovich, Horia Toma and Gerard Berry, "Efficient Latch Optimization Using Exlusive Sets", in the proceedings of $34^{th}$ Design Automation Conference, pp. 8–11, Jun. 1997.

Herve Touati et al. "Implicit State Enumeration of Finite State Machines using BDD's" in the proceedings of the International Conference on Computer–Aided Design ICCAD90, pp. 130–133, Nov. 1990.

Gerard Berry and Herve Touati, "Optimized Controller Synthesis Using Esterel", proceedings of the International Workshop on Logic Synthesis IWLS93, pp. 1–15, Lake Tahoe, 1993.

Andrew Seawright and Forrest Brewer, "High Level Symbolic Construction Techniques For High Performance Sequential Synthesis", in the Proceedings of $30^{th}$ ACM/IEEE Design Automation Conference, pp. 424–428, Jan. 1993.

Ellen M. Sentovich, Horia Toma and Gerard Berry, "Latch Optimization in Circuits Generated from High–level Descriptions", in INRIA Research Reports of INRIA Sopia–Antipolis, Cedex, Le Chesnay Cedex, France, vol. 2943, pp. 1–19, Jul. 1996.

Andrew Seawright and Forrest Brewer, "Synthesis from Production–Based Specification", in the proceedings of $29^{th}$ ACM/IEEE Design Automation Conference, pp. 194–199, 1992.

G. Cabodi et al., Improved Reachability Analysis of Large Finite State Machines, 1996 IEEE/ACM International Conference on Computer–Aided Design, pp. 354–360, Nov. 1996.*

S. Devadad et al., MUSTANG: State Assignment of Finite State Machines targeting Multilevel Logic Implementations, Computer–Adied Design of Integrated Circuits and Systems, pp. 1290–1300, Dec. 1988.*

J. Kukula et al., Finite State Machine Decomposition By Transition Pairing, IEEE International Conference on Computer–Aided Design, pp. 414–417, Nov. 1991.*

S. Devades et al., Boolean Decomposition in Multilevel Logic Optimization, IEEE Journal of Solid–State Circuits, pp. 399–408, Apr. 1989.*

T. Villa et al., NOVA: State Assignment of Finite State Machines for Optimal Two–Level Logic Implementation, IEEE Transactions on Computer–Aided Design of Integrated Circuits and Systems, pp. 905–924, Aug. 1990.*

J.R. Burch et al., Symbolic Model Checking for Sequential Circuit Verification, IEEE Transactions on Computer–Aided Design of Integrated Circuits and Systems, pp. 401–424, Apr. 1994.*

J. Bei et al., FSM Modeling of Synchronous VHDL Design for Symbolic Model Checking, Design Automation Conference, pp. 363–366, Jan. 1999.*

P. Ashar et al., Optimum and Heuristic Algorithms for an Approach to Finite State Machine Decomposition, pp. 296–310, Mar. 1991.*

* cited by examiner

FSMcircuit SYNTHESIZED FROM A HIERARCHICAL HIGH-LEVEL DESCRIPTION

FIG. 3 RELATIONSHIP BETWEEN THE HIGH-LEVEL DESCRIPTION AND THE TRANSLATED CIRCUIT

401. PartitionedCompile(Highlevel_description top_node, circuit top)
    {
402.    R(X) = AnalyzeCircuit(top)
403.    ChoosePartitions(top_node, top, R(X))
404.    foreach partition p designated in top {
405.        c = ExtractSubCircuit (top, p)
406.        g = CreateStateGraph (c, R(X))
407.        g' = MinimizeStateGraph (g)
408.        EncodeStateGraph (g')
409.        c' = StateGraphToCircuit(g')
410.        MergeBackSubCircuit(top, p, c')
411.    }
412. }

OVERALL COMPILE PROCESS

FIG. 4

```
501.    AutoPart(Highlevel_description top_node, circuit top, R(X))
502.    {
503.            CollectData (top_node, R(X))
504.            PickPartitions(top_node)
505.    }
506.
507.    CollectData (node n, R_p (X))
508.    {
509.            R_{Mn} (X_{Mn}) = ∃ (X_i'S ∉ X_{Mn}) R_p (X)
510.            num_states_n = num_minterms (R_{Mn} (X_{Mn}))
511.            foreach child node c of node n {
512.                    CollectData (c, R_{Mn} (X_{Mn}))
513.            }
514.    }
515.
516.    PickPartitions (node n)
517.    {
518.            if (num_states_n < MinStates) {
519.                    return;
520.            }
521.            if (num_states > MaxStates) {
522.                    foreach child node c of node n {
523.                    PickPartitions (c)
524.            } else {
525.                    MarkPartition (c);
526.                    return;
527.            }
528.    }
```

MAXIMUM STATE THRESHOLD ALGORITHM

FIG. 5

NEXT STATE FUNCTIONS $X0 = 0$ $X1 = a*X0 + a*X8$ $X2 = X1$ $X3 = a'*X0 + a'*X8$ $X4 = X2 + X3$ $X5 = a*X4$ $X6 = a'*X4$ $X7 = b'*X5 + b'*X6 + b'*X7$ $X8 = b*X5 + b*X6 + b*X7$

ACTION TRIGGER FUNCTIONS $Y0 = X1$ $Y1 = a'*X0 + a'*X8$ $Y2 = a*X4$ $Y3 = a'*X4$

INITIAL STATE $X0 * X1' * X2' * X3' * X4' * X5' * X6' * X7' * X8'$

FSM CIRCUIT

FIG. 9A

REACHABILITY FUNCTION OF TOP, R(X) =

X0 * X1' * X2' * X3' * X4' * X5' * X6' * X7' * X8' +
X0' * X1 * X2' * X3' * X4' * X5' * X6' * X7' * X8' +
X0' * X1' * X2 * X3' * X4' * X5' * X6' * X7' * X8' +
X0' * X1' * X2' * X3 * X4' * X5' * X6' * X7' * X8' +
X0' * X1' * X2' * X3' * X4 * X5' * X6' * X7' * X8' +
X0' * X1' * X2' * X3' * X4' * X5 * X6' * X7' * X8' +
X0' * X1' * X2' * X3' * X4' * X5' * X6 * X7' * X8' +
X0' * X1' * X2' * X3' * X4' * X5' * X6' * X7 * X8' +
X0' * X1' * X2' * X3' * X4' * X5' * X6' * X7' * X8

REACHABILITY FUNCTION OF M, $R_M(X_M)$ =

X5' * X6' * X7' * X8' +
X5 * X6' * X7' * X8' +
X5' * X6 * X7' * X8' +
X5' * X6' * X7 * X8' +
X5' * X6' * X7' * X8

DERIVING $f_n(X, I)$ $f_1(X, I)$ = X4

XNOR CORRESPONDING $f_n(X, I)$ AND $i_n$

X4*$i_1$ + X4'*$i_1$'

XNORs ANDed TOGETHER

X4*$i_1$ + X4'*$i_1$'

AND WITH R(X) TO PRODUCE $T(X, I_M)$ =

FULLY COMPUTING $T(X, I_M) =$ $i_1'*X0 * X1' * X2' * X3' * X4' * X5' * X6' * X7' * X8' +$
$i_1'*X0' * X1 * X2' * X3' * X4' * X5' * X6' * X7' * X8' +$
$i_1'*X0' * X1' * X2 * X3' * X4' * X5' * X6' * X7' * X8' +$
$i_1'*X0' * X1' * X2' * X3 * X4' * X5' * X6' * X7' * X8' +$
$i_1'*X0' * X1' * X2' * X3' * X4 * X5' * X6' * X7' * X8' +$
$i_1'*X0' * X1' * X2' * X3' * X4' * X5 * X6' * X7' * X8' +$
$i_1'*X0' * X1' * X2' * X3' * X4' * X5' * X6 * X7' * X8' +$
$i_1'*X0' * X1' * X2' * X3' * X4' * X5' * X6' * X7 * X8' +$
$i_1'*X0' * X1' * X2' * X3' * X4' * X5' * X6' * X7' * X8 +$
$i_1*X0' * X1' * X2' * X3' * X4' * X5' * X6' * X7' * X8'$

EXISTENTIALLY QUANTIFY OUT X0, X1, X2, X3 AND X4 TO PRODUCE $T_M(X_M, I_M) =$ $i_1'*X5' * X6' * X7' * X8' +$
$i_1'*X5 * X6' * X7' * X8' +$
$i_1'*X5' * X6 * X7' * X8' +$
$i_1'*X5' * X6' * X7 * X8' +$
$i_1'*X5' * X6' * X7' * X8 +$
$i_1*X5' * X6' * X7' * X8'$

METHOD AND APPARATUS FOR OPTIMIZED PARTITIONING OF FINITE STATE MACHINES SYNTHESIZED FROM HIERARCHICAL HIGH-LEVEL DESCRIPTIONS

CROSS-REFERENCE TO RELATED APPLICATION

This application claims the benefit of U.S. Provisional Application 60/072,381, Express Mail Number EM320545420US, filed Jan. 9, 1998, to James Andrew Garrard Seawright, entitled Method and Apparatus For Optimal Partitioning of Finite State Machines Synthesized From Hierarchical High-level Descriptions, under 35 U.S.C. §119 (e), which is herein incorporated by reference.

FIELD OF THE INVENTION

The present invention relates generally to the optimization of finite state machines (FSMs) synthesized from hierarchical high-level descriptions. More specifically, the present invention relates to determining partitions of a hierarchical high-level description which will lead to greater optimization when synthesized into an FSM.

BACKGROUND OF THE INVENTION

To tackle the exponential growth in the complexity of digital circuits, designers are moving to higher levels of abstraction in the design process. In control dominated applications, several abstractions are popular for managing the complexity of the design of sequential control logic. These techniques use an input language whose level of abstraction is above explicit FSM (finite state machine) design techniques that use state transition tables or RTL (register transfer level) HDL (hardware description language) descriptions.

In these abstractions, the high-level controller description is typically described in a hierarchical fashion as depicted by the tree in FIG. 1. The nodes of the tree, which are stored in the memory of a data processing system, represent the compositional operators of the control abstraction. For example, a particular node might indicate the sequencing or the concurrent execution of the sub-behaviors represented by the node's children (or sub-nodes).

Synthesis of circuits from these hierarchical high-level abstractions involves the translation of the high-level controller description into an initial FSM (FIG. 1). Typically, the synthesis is performed as an initial translation step (in which a high-level description 100 is translated into an unoptimized FSM 101) followed by optimization steps (which transform FSM 101 into optimized FSM 102). High-level description 100 is hierarchical in the sense that it has a top-level node 100, with child nodes 105 and 104. This hierarchical organization follows, recursively, for each of the child nodes. Initial FSM 101 comprises, in a general sense, functional logic 106 and register bits 107, wherein all register bits 107 receive the same clock signal. Optimized FSM 102 comprises functional logic 108 and register bits 109. Functional logic 108 is simpler than functional logic 106 and/or register 109 has fewer bits than register 107. Both FSMs 101 and 102 provide the same functionality with respect to the primary inputs and outputs of the FSM.

The translation ensures correct implementation of the high-level semantics into an FSM, and the subsequent optimizations aim to reduce the cost of the implementation while preserving the observable sequential behavior. In conventional systems, the optimizations are performed without any additional guidance from the structure of the high-level description.

For example, classical FSM optimization techniques include state minimization, state assignment, state encoding and sequential circuit level optimizations such as retiming. This separation of the translation and optimization phases leads to the loss of information about the high-level description that is useful for optimization.

Other known methods for optimizing FSMs generated from high-level descriptions use the structure of the high-level representation to determine an over-approximate reachable state set, but do not use the structure of the high-level language directly in the optimization strategy. Some known techniques do in fact use the structure of the input description, however, information about the global reachability and observability is unknown, thus the optimizations are generally local in scope.

It would therefore be desirable to have a method for automatically optimizing FSMs synthesized from high-level descriptions which uses the structure of the high-level description in conjunction with global reachability information in order to select sub-FSMs for optimization which achieve circuits that are more highly optimized.

It would further be desirable to have a method which achieves greater optimization of sub-FSMs by using global reachability information while optimizing a selected sub-FSM.

SUMMARY OF THE INVENTION

In circuit synthesis software in accordance with a preferred embodiment of the present invention, finite state machines (FSMs) are translated from hierarchical high-level descriptions and optimized. Optimization involves partitioning. With respect to the hierarchical high-level description a partition is the subtree defined by a selected node. With respect to the translated FSM, a partition is a subset of the next state functions, a subset of the output functions and a subset of the state variables corresponding to the selected subset of functions. Partitions of the FSM are selected by scanning the nodes of the hierarchical description and assigning to each suitable node a metric based upon the reachability function of the FSM. The metric is an indicator of the desirability of using the partition of the FSM, corresponding to the node, as a region of the FSM upon which to apply FSM optimization techniques. Based upon the metric, the software selects certain partitions for optimization. Optimization of a partition can include the steps of converting the partition to a state graph, state graph minimization, state assignment (also known as re-encoding) and conversion back to an FSM. Any hierarchical high-level language is suitable for use with the present invention, provided that a correspondence between nodes of the high-level description and partitions of the FSM can be determined. Conversion of an FSM partition for the purposes of optimization is performed with pruning functions also derived from the FSM's reachability function.

In general, the invention comprises the following method, the steps of which are performed by a data processing system: scanning at least one node of a hierarchical description of a finite state machine; assigning, for each node of the hierarchical description scanned, a metric determined from a reachability function of the finite state machine; and selecting, according to the metric, certain nodes of the hierarchical description as defining a partition of the finite state machine for optimization.

The invention also comprises the following method, the steps of which are performed by a data processing system: generating at least one state or state transition of a state graph from a finite state machine; and determining whether the state or state transition is valid from the reachability function of the finite state machine.

Furthermore, the invention comprises the following method, the steps of which are performed by a data processing system: assigning a property to an input description; translating the input description into a first finite state machine, wherein the first finite state machine comprises at least a second finite state machine; generating at least one state or state transition of a state graph from the second finite state machine; and determining whether the state or state transition is valid from the property of the input description.

BRIEF DESCRIPTION OF THE DRAWINGS

The accompanying drawings, that are incorporated in and constitute a part of this specification, illustrate several embodiments of the invention and, together with the description, serve to explain the principles of the invention.

FIG. 4 depicts an overall method by which a high-level input description, and its translated circuit, are partitioned and optimized, in accordance with the present invention;

FIG. 5 depicts a method by which partitions are selected, in accordance with the present invention;

FIG. 9A depicts a virtual circuit representation of the FSM circuit of FIG. 8 in accordance with the Protocol Compiler software product;

FIGS. 9B and 9C show the steps for determining the pruning relations, in accordance with the present invention, for the example partition selected from the FSM circuit of FIG. 8;

FIG. 11A depicts a pruned, but unoptimized, state graph of a sub-circuit of FIG. 8 produced in accordance with the present invention, while FIG. 12A depicts an optimization of the state graph of FIG. 11A, while

DETAILED DESCRIPTION OF PREFERRED EMBODIMENTS

Figure 1:
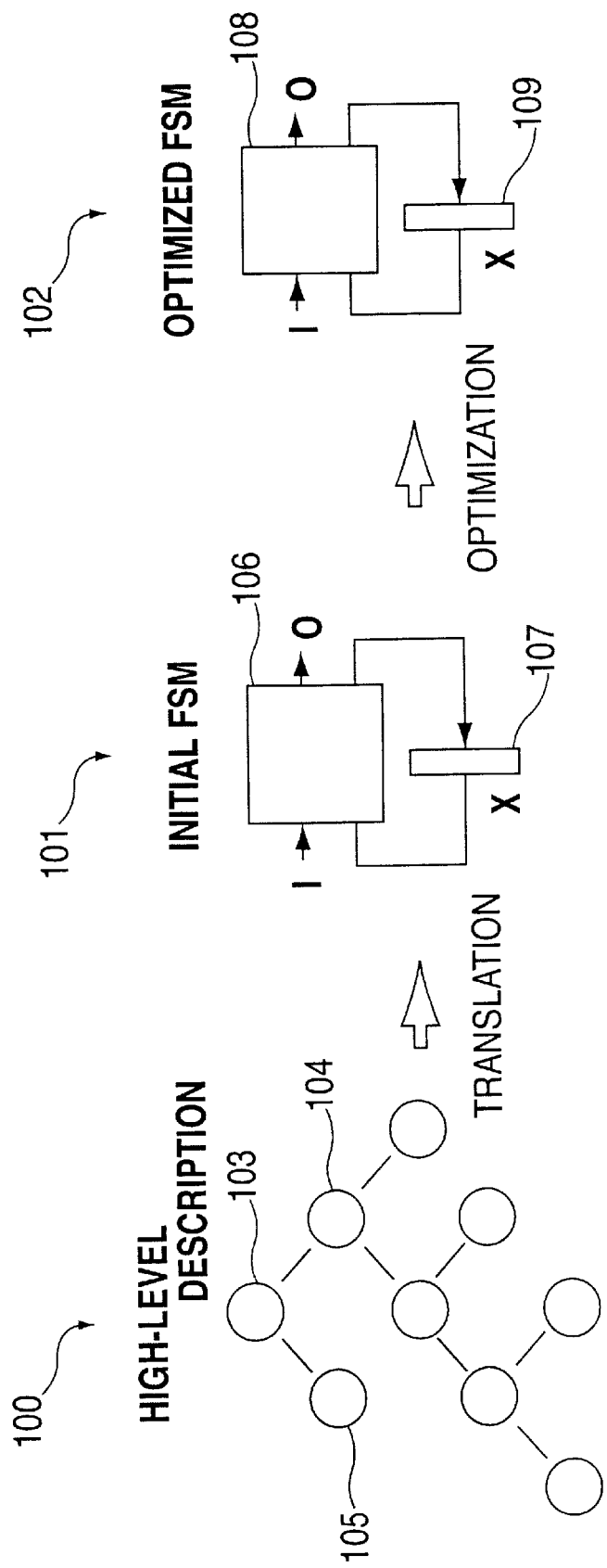
FIG. 1 depicts the main stages of synthesizing a high-level input description into an optimized FSM through the steps of translation and optimization.

Reference will now be made in detail to preferred embodiments of the invention, examples of which are illustrated in the accompanying drawings. Wherever possible, the same reference numbers will be used throughout the drawings to refer to the same or like parts.

The FSM produced by the translation of a high-level description (which may also be referred to as an FSM circuit or merely a circuit) is typically represented in two ways, either of which can be represented in the memory of a data processing system. An FSM circuit may be a netlist including gates and registers. Alternatively, an FSM circuit may comprise the next state and output functions of the FSM, with the functions preferably represented by binary decision diagrams (BDDs).

The compilation strategy of the preferred embodiment of the present invention can be summarized as the two following main steps.

First, the unoptimized FSM circuit is analyzed to yield its reachability function which shall be referred to, for the purposes of this patent, as R(X). The reachability function receives a vector of X bits as input which represents a state of the FSM circuit. The reachability function outputs a one if the input state X can be reached by the FSM circuit and outputs a zero if such a state cannot be reached.

R(X) is preferably determined by implicit techniques. Explicit techniques, however, such as state graphs, can also be used to find R(X). If it is too difficult to determine R(X) exactly, an over-approximate R(X) may be used instead.

The implicit determination of R(X) is preferably performed using a BDD-based approach as described in O. Coudert, C. Berthet, and J. C. Madre, "Verification of Synchronous Sequential Machines Based on Symbolic Execution," in Automatic Verification Methods for Finite State Systems, International Workshop, Grenoble France, vol. 407, Lecture Notes in Computer Science, Springer-Verlag, June 1989, which is herein incorporated by reference, and H. Touati et al, "Implicit State Enumeration of Finite State Machines using BDD's," Proceedings of International Conference on Computer-Aided Design ICCAD90, pp. 130–133, November 1990, which is herein incorporated by reference. An over-approximate reachable state set can be determined using heuristics based on the input description as described in E. Sentovich, H. Toma, G. Berry, "Efficient Latch Optimization Using Exclusive Sets," Proceedings of 34th Design Automation Conference, pp. 8–11, June 1997, which is herein incorporated by reference.

Conventional implicit techniques can be also be applied partially in order to determine an under-approximate R(X). Such a partial application may be used if a full and exact determination of R(X) is too difficult. In the discussion which follows, an under-approximate R(X) could be used in the determination of metrics for the selection of the partitions. Once a partition has been selected, however, its sub-circuit cannot be converted into a state graph for optimization using an under-approximate R(X).

The determination of R(X) is very useful because from R(X) information can be extracted relating to how any particular partition of the FSM circuit sequentially interacts, in a global manner, with the rest of the FSM circuit.

Figure 2:
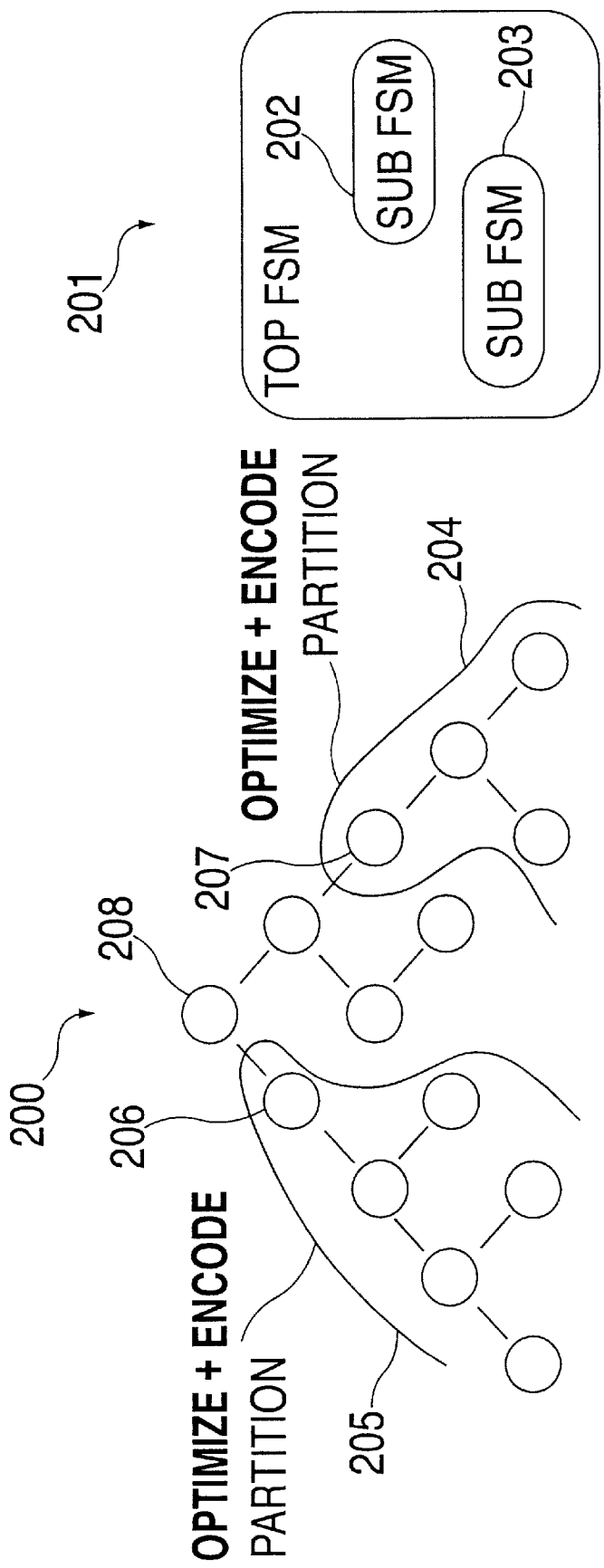
FIG. 2 depicts the correspondence between partitions of the input description and sub-FSMs of a translated circuit.

The second major step of the compilation strategy of the described embodiment of the present invention uses the R(X) obtained by the above analysis and, in conjunction with the structure of the high-level specification, performs FSM circuit partitioning and sub-FSM circuit optimization of the selected partitions (FIG. 2). The sub-FSM circuit optimizations are preferably performed using state graph based minimization and re-encoding techniques which directly use R(X), as described below.

FIG. 2 show a hierarchical high-level description 200 which has been translated into an FSM circuit 201. Partitions 205 and 204 have been identified in the high-level description using a method described below in detail. As with any partition of a high-level description, partition 205 is a subtree of high-level description 200. The root of partition 205's subtree is node 206. Partition 204 is another subtree of high-level description 200, wherein the root of the subtree is node 207. Partition 205 of the high-level description corresponds to sub-FSM circuit 202, while partition 204 corresponds to sub-FSM circuit 203. Assuming that they represent partitions selected for optimization, sub-FSM circuits 202 and 203 are optimized using state graph based minimization and re-encoding techniques which directly use R(X), as described below.

State graph minimization techniques are powerful because states are merged in a global way relative to the scope of the total state graph being considered for optimization. During state minimization, states which are indistinguishable in terms of all future possible sequences of outputs are merged. After minimization, state graph encoding can select new state codes for each state using a variety of techniques. State encoding can reduce the number of registers to the minimum required or the re-encoding can be done using other metrics. However, state graph techniques have several limitations. State graphs will explode due to unsynchronized concurrency present in the design. Even though state graph minimization is possible for state graphs far beyond thousands of states, the effectiveness of re-encoding state graphs beyond a few hundred states is poor. Re-encoding eliminates state register bits by achieving a greater utilization of the total number of possible states of an FSM circuit. This greater utilization, however, requires greater complexity of the next state logic which decodes the current state and outputs an encoded next state. For state graphs beyond a few hundred states it is generally the case that the larger next state logic outweighs the savings in register cost.

A preferred embodiment of the present invention incorporates manual control by the designer. For example, the designer can select certain partitions for optimization, using any appropriate user interface, while letting automatic methods partition the rest of the FSM circuit. In addition, or alternatively, the designer can indicate that certain partitions are not to be selected by automatic methods. These manual methods are accomplished by the designer placing partitioning attributes on nodes of the high-level description via a user interface.

Figure 3:
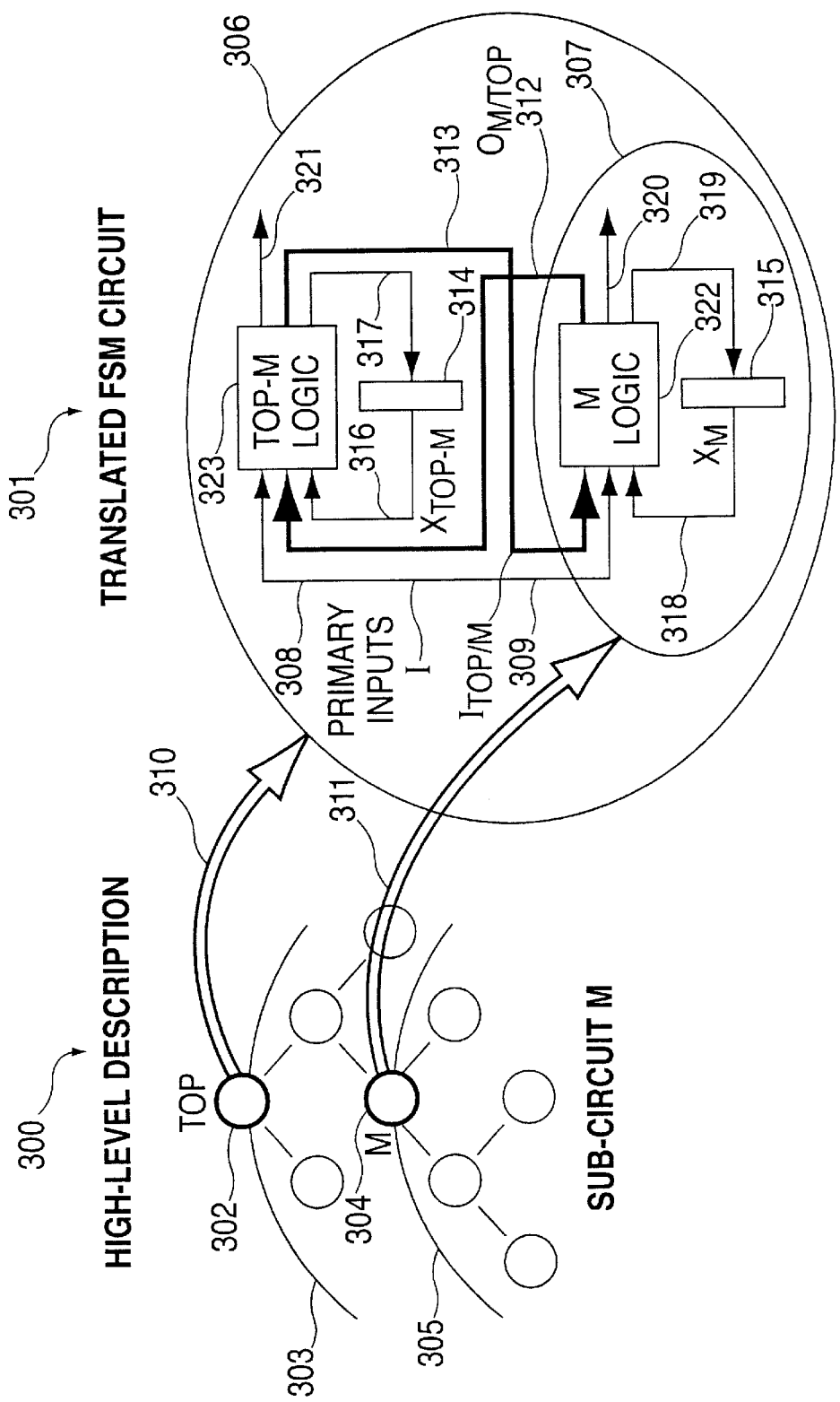
FIG. 3 depicts a partition with respect to the remainder of the high-level description tree and the partition's corresponding sub-circuit with respect to the remainder of the translated circuit.

A preferred embodiment of the present invention can be used in conjunction with any FSM synthesis system which, for each node of hierarchical structure of the high-level input description, permits the location of the corresponding sub-FSM circuit of the initial translated FSM circuit (FIG. 3). Details of how to maintain this correspondence is discussed below in the context of presenting a specific high-level input example for optimization. FIG. 3 depicts a high-level description 300 and its corresponding translated FSM circuit 301. Top-level node 302 of the high-level description 300 has a pointer 310 to the entire FSM circuit 306. Partition 305 (also known as sub-circuit M) is a subtree represented by node 304. Node 304 has a pointer 311 to sub-circuit 307 of the total FSM circuit 306. Thus the total FSM circuit 306 has been divided into two parts: sub-circuit 307 (comprising M functional logic 322 and state variable register 315), and the rest of FSM circuit 306 (called sub-circuit Top-M and comprising functional section 323 and register bits 314). FSM circuit 306 has primary inputs I, some or all of which are directed to sub-circuit Top-M via bus 308. Some or all of the primary inputs of FSM circuit 306 are directed to sub-circuit 307 via bus 309. FSM circuit 306 has primary outputs provided by bus 321 of sub-circuit Top-M and bus 320 of sub-circuit 307. Sub-circuit 307 has certain inputs, called $I_{Top/M}$, which are driven only by sub-circuit Top-M over bus 313. Sub-circuit 307 also has certain output, called $O_{M/Top}$, which drive only certain inputs of sub-circuit Top-M over bus 312.

The pseudocode for the overall compile process is presented in FIG. 4 and will now be discussed. This process is performed, for example, by a processor of a data processing system executing instructions stored in a memory of the data processing system. The processes of all pseudocode discussed herein are embodied as such a processor executing instructions in a memory.

After the initial translation of the high-level description (top_node) into an initial circuit (top), a reachability analysis is performed (AnalyzeCircuit( ) in step 402) to determine the set of reachable states R(X) of the entire circuit.

After the reachablility analysis is complete, circuit partitions are selected by the routine ChoosePartitions( ) in step 403. As described above, various preferred embodiments choose those partitions: (i) according to manual selections of the designer, (ii) according to the automatic methods of the present invention, or (iii) in a hybrid manual and automatic mode as described above. Automatic partition selection is described in detail later.

Each partition is optimized by extracting the logic for the designated high-level description node as a sub-circuit (ExtractSubCircuit( ) in is then converted into a state transition graph (CreateStateGraph( ) in step 406) which is minimized and re-encoded (MinimizeStateGraph( ) in step 407 and EncodeStateGraph( ) in step 408). The conversion of the sub-circuit into a state transition graph is done using a method, discussed later, which creates a state transition graph, by utilizing R(X), that reflects only those states of the sub-FSM that can be reached in normal operation of the entire machine. The minimized and re-encoded state transition graph is converted back into a circuit (StateGraphToCircuit( ) in step 409) and this optimized circuit is merged with the rest of the FSM circuit (MergeBackSubCircuit( ) in step 410). A level of design hierarchy can be inserted to make a hard boundary around the optimized subcircuit.

Figure 6:
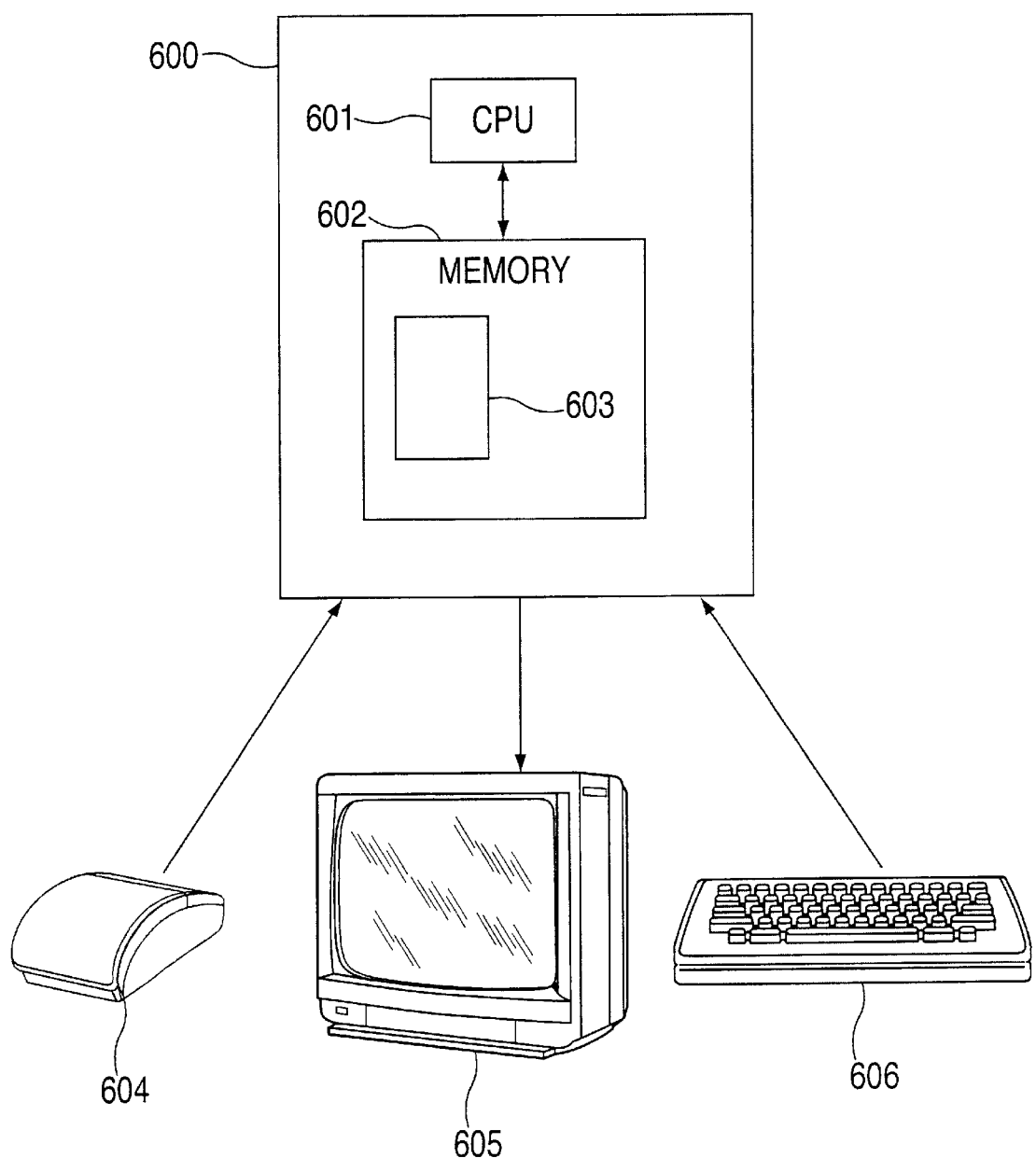
FIG. 6 illustrates the typical hardware computing environment in which the software in accordance with a preferred embodiment of the present invention is executed.

Typically, PartitionedCompile( ) is executed within the computing environment (or data processing system) such as that of FIG. 6. FIG. 6 depicts a workstation computer 600 comprising a Central Processing Unit (CPU) 601 (or other appropriate processor or processors) and a memory 602. Memory 602 has a portion of its memory 603 in which is stored FSM synthesis tools related to the present invention. In particular, memory 603 contains PartitionedCompile( ) and may also contain the software which translates the hierarchical high-level input description top-node into the circuit top. Memory 603 also contains representations of the FSM and optimized FSMs described herein. While memory 603 is depicted as a single region, those of ordinary skill in the art will appreciate that, in fact, such software may be distributed over several memory regions or several computers. Furthermore, depending upon the computer's memory organization (such as virtual memory), memory 602 may comprise several types of memory (including cache, random access memory, hard disk and networked file server). Computer 600 is equipped with a display monitor 605, a mouse pointing device 604 and a keyboard 606 to provide interactivity between the software of the present invention and the chip designer. Computer 600 also includes a way of reading computer readable instructions from a computer readable medium (not shown) into the memory 602.

Above is described the overall compilation flow and how individual subcircuits are extracted and optimized. An example of a preferred embodiment is presented below, which includes an effective heuristic for automatically identifying the sub-circuits to extract and optimize.

The heuristic operates by partitioning the FSM circuit, based on the high-level description, into the fewest sub-circuits each having the largest number of unoptimized states below some maximum state threshold. This method is based on the observation (discussed above) that the re-encoding of state graphs is most effective for unoptimized state graphs below a certain size. Above this threshold, the complexity of the next state combinational logic generally outweighs the savings in register cost. The threshold is set at a size such that unoptimized state graphs of this size or less—when optimized and re-encoded—will be implemented in logic with high efficiency.

A minimum state threshold is also used. Partitions are not created below the minimum state threshold. The rational for a minimum state threshold is that below a few number of states, there is usually no value in extracting a tiny state graph and re-encoding it. This threshold is typically less than five states.

The pseudocode for the automatic partitioning algorithm AutoPart( ) is shown in FIG. 5. In a preferred embodiment of a synthesis system that combines manual designer control with automatic partitioning, AutoPart( ) would be called by the procedure ChoosePartitions( ) discussed above. In a preferred embodiment of a synthesis system which is completely automatic, ChoosePartitions( ) would be identical to AutoPart( ).

The first step of AutoPart( ): CollectData( ) (invoked by step 503 and defined by steps 507–14), collects data about the number of states in the FSM circuit contributed by each node of the high-level specification. This routine recursively traverses the high-level description, and for each node of the description, determines as a heuristic metric the unoptimized number of states of the sub-circuit corresponding to the node of the specification. The number of unoptimized states for a node is determined by smoothing out the state variables of the parent node's reachable state set $R_{p(X)}$ passed down which are not state variables of the node (step 509). This smoothing out (also known as existential quantification) is denoted as follows:

$$R_{Mn}(X_{Mn}) = \exists (x_i\text{'s} \notin X_{Mn}) R_p(X)$$

Existential quantification is a method of creating a Boolean function which no longer depends upon a specific variable or variables. For each variable to be existentially quantified out, the following steps are performed. First, the Boolean function is evaluated with the variable set to true. Second, the Boolean function is evaluated with the variable set to false. Third, the functions produced in the first and second steps are logically ORed together.

The number of unoptimized states for a node is determined from the node's reachable state set by determining the number of minterms in $R_{Mn}(X_{Mn})$ (step 510). The algorithm recurses for each child node and passes down the node's reachable state set $R_{Mn}(X_{Mn})$ (step 512).

Next, the high-level description is recursively traversed (by PickPartitions( ) which is invoked by step 504 and defined by steps 516–28) to select partition points in a top-down fashion, using a greedy heuristic, according to the data collected by the CollectData( ) routine.

If the number of unoptimized states for a node is less than the minimum state threshold MinStates, the recursion is terminated (in steps 518–19). If the number of unoptimized states for a node is larger than the maximum state threshold MaxStates, the routine recurses for each child node, searching for partitions (in steps 521–3). If the number of unoptimized states for a node is less than the maximum state threshold MaxStates, then the node represents the largest sub-tree below the threshold and the node is marked as a sub-circuit to partition (in steps 524–6).

The rationale behind AutoPart( ) is that it uses the structure of the high-level description and the global reachability information to partition the FSM circuit along the lines of the actual concurrency in the design.

The reachability information permits concurrently described behaviors which are actually synchronized in their execution—for example two processes, each executing for the same fixed number of clock cycles—to be selected as a single partition, extracted as a single state graph, and merged together. Since the synchronization of the two processes does not lead to a Cartesian product of the state spaces, the number of states of the collection of the synchronized processes can be on the order of the number of states of each individual process. In such a case, the number of states determined by CollectData( ), for the node representing the collection of synchronized processes, will in fact usually be on the order of the number of states of each individual process because R(X) allows such synchronized behavior to be extracted.

Concurrent behaviors that are independent or loosely interacting are generally selected as independent partitions by the described embodiment, since their concurrent execution leads to the Cartesian product of the state space of the individual concurrent behaviors. Thus, the partitioning algorithm tends to break the Cartesian products and each concurrent behavior is extracted and optimized separately.

CollectData( ) can, of course, collect other data about the sub-circuits represented by each high-level description node than the metric of the number of unoptimized states predicted for a node based upon R(X). For example, CollectData( ) can assign to each node the number of state variables of the node's corresponding sub-circuit. Another example is the determination of the actual number of states for a node's sub-circuit by actually doing the optimization of the node's sub-circuit. Depending upon which data is collected by CollectData( ), other metrics or selection strategies can be used in PickPartitions( ).

For example, based upon both the number of unoptimized states of the sub-circuit corresponding to the node of the specification and the number of state variables representing those states a heuristic metric of coding efficiency can be determined. A node with many state variables representing relatively few unoptimized states is a good candidate for greater compactness through re-encoding since this is an indication of poor encoding efficiency. Such a metric can be used by PickPartitions( ) by selecting a threshold of minimum encoding efficiency for which a node must fall below before the node is selected as indicating a partition.

The coding efficiency metric will be further illustrated by the following examples. A node with 3 state variables for 8 unoptimized states would not be a good candidate for re-encoding since 8 is the maximum number of states for 3 variables. A node with 57 state variables for 166 unoptimized states would be an excellent candidate since $2^{57}$ (the maximum number of states for 57 variables) is much larger than 166. It is therefore likely that fewer than 57 variables can be used to represent the 166 states while still not offsetting the register reduction by more complex next state combinational logic. Finally, a node with 40 state variables and 8000 unoptimized states would not be a good candidate for reencoding (even though $2^{40}$ is much larger than 8000) because it has been shown experimentally that state graphs with more than a few hundred states do not optimize well.

Another example is to use both the unoptimized and actual number of states as a metric in choosing a partition. During CollectData( ), any node whose unoptimized number of states is below some maximum threshold (typically greater than the MaxStates threshold) has its sub-circuit actually optimized and the number of actual states stored with the node. PickPartitions( ) then traverses the high-level description and selects any node whose unoptimized or actual number of states is below MaxStates.

Node selection methods (wherein the node represents a partition) other than the greedy heuristic can be used. Assume, for example, a coding efficiency metric in which the larger the metric's value (on some positive scale) the greater the coding efficiency. Partitions can then be selected such that the FSM circuit is completely covered and the sum of the efficiency metrics of the selected partitions is at a maximum.

Referring back to the pseudocode for the overall compile process in the embodiment of FIG. 4, once ChoosePartitions( ) has completed its operation, each partition is optimized according to a process which uses six main functions. The details of the step of creating the state graph (CreateStateGraph( ) in step 406) will now be explicated. This generation of the state graph uses the reachability function R(X) which permits the elimination of both invalid states and invalid transitions (even invalid transitions between valid states) from the generated state graph. Conventional methods of creating a state graph, which do not use R(X), create a state graph which is exponentially larger than necessary, thus limiting the amount of optimization which can be accomplished.

In order to effectively optimize a sub-circuit, the communication between the sub-circuit and the rest of the circuit must be carefully considered in the state graph generation process. Consider the diagram in FIG. 3 which shows the logic for a sub-circuit M in relation to the rest of the circuit Top (denoted as Top-M). The sub-circuit extracted for M comprises all the combinational logic (M logic 322) and registers ($X_M$ 315) for the sub-tree M in the high-level description. $I_{Top/M}$ designates the portion of inputs to M which are internal wires from other parts of the circuit and are not among the primary inputs to Top. The set of all primary inputs to the circuit is denoted as I. In a similar way, a portion of the outputs of M are internal wires to the rest of the circuit and are not primary outputs. These outputs are designated $O_{M/Top}$.

Optimization of M must consider the sequential behavior of the inputs $I_{Top/M}$ as these inputs are internally generated control signals and their signal values are typically strongly correlated with the sequential behavior of M itself. The sequential don't care information about $I_{Top/M}$ is accounted for through the use of R(X) in the methods of the present invention and is what prevents the extracted state graph of M from being exponentially larger than necessary.

The state graph for a sub-circuit is preferably generated in a breadth-first process. Starting with the initial state of the sub-circuit, the next states and next state transitions are enumerated by forward image calculations of the present states through the next state logic as described in O. Coudert, C. Berthet, and J. C. Madre, "Verification of Synchronous Sequential Machines Based on Symbolic Execution", incorporated by reference above, and H. Touati et al, "Implicit State Enumeration of Finite State Machines using BDD's", incorporated by reference above. Each new state visited and each new transition traversed is tested with respect to the global reachability information of the entire circuit to determine if the state transition of the sub-circuit is consistent with the overall circuit. States and transitions traversed consistent with the overall circuit are allocated as the nodes and edges of the state transition graph. States and transitions of the sub-circuit inconsistent with the global circuit are pruned.

Invalid states of a sub-circuit M are pruned during state graph construction by testing each generated state for its inclusion in the set of reachable states of M, denoted as $R_M(X_M)$. As discussed above with respect to CollectData( ), the states of an unoptimized sub-circuit are determined by smoothing out of R(X) the state variables of the entire circuit which are not in the sub-circuit M (these are the state variables of register 314 with respect to sub-circuit 307 in FIG. 3). This smoothing out is denoted as follows:

$$R_M(X_M) = \exists (x_i\text{'s} \notin X_M) R(X)$$

Invalid transitions of a sub-circuit M are pruned during state graph construction by testing each generated transition with a transition pruning relation $T_M(X_M, I_M)$, where $I_M = I \cup I_{Top/M}$. This pruning relation is a Boolean function returning true if and only if the current state of the sub-circuit M and the input combination specified leads to a valid next state. $T_M(X_M, I_M)$ is determined as follows.

First, where k is the number of individual inputs represented by $I_{Top/M}$, and here $1 \leq n \leq k$, each individual input of $I_{Top/M}$ shall be referred to as $i_n$. For each $i_n$, a function describing how the $i_n$ is driven by the global circuit (in FIG. 3 there is global circuit 306), in terms of state variables and primary inputs, is derived and denoted as $f_n(X,I)$.

Second, each $f_n(X,I)$ is exclusive NORed with its corresponding $i_n$.

Third, the results of the exclusive NORs are all ANDed together.

Fourth, the result of the AND is itself ANDed with R(X) to produce the transition pruning relation $T(X, I_M)$.

Fifth, since we don't care about the state variables not in sub-circuit M, we existentially quantify them out to produce the desired pruning relation:

$$T_M(X_M, I_M) = \exists (x_i\text{'s} \notin X_M) T(X, I_M)$$

Another way of creating a pruning relation is from designer-asserted properties which can be attached to any node of the high-level input description. For example, the designer can assert, via indications in the high-level description or via a user interface with the synthesis software tool, that certain nodes of the high-level description do not represent pipelined sub-circuits. A pipelined circuit is defined as follows. Consider a sub-machine M which waits in its initial state until receiving a start signal. Sub-machine M is pipelined if M can receive a start signal before M has finished the processing begun by the previous start signal. If M is not pipelined, the following transition pruning relation can be constructed (without resort to a reachability function):

$$T_M(X_M, I_M) = X_{MO} + (\overline{X_{MO}} * \overline{\text{start}})$$

This pruning relation is interpreted as follows. If M is in the initial state (denoted as $X_{MO}$), then a transition is valid with start either true or false. If M is not in the initial state, then a transition is only valid with start being false. If a state cannot be reached because of this transition pruning relation, that state can also be pruned. After pruning has been accomplished, transitions can be simplified as follows. Find the care set for each state (call it state X) of the generated state graph for a sub-circuit. The care set for state X is the logical sum of the state's input condition boolean formulae, where each input condition boolean formula is responsible triggering an unpruned transition out of the state X. If the care set is not equal to a logical one, then it is possible to minimize (using known techniques) at least some of the input condition boolean formulae triggering a transition out of the state X. Transition simplification can be accomplished as part of the CreateStateGraph( ) step 406 of FIG. 4.

Following pruning or transition simplification, the state transition graph for each selected sub-circuit is optimized by minimization (also known as state minimization) and re-encoding (also known as state encoding). During the state minimization process (performed by MinimizeStateGraph( ) discussed above), all of the sub-circuit's outputs (including those to the rest of the circuit) must be maintained since they are observable by the other parts of the circuit. After state minimization, several state encoding methods can be applied. For manual partitioning, the designer can select a particular style of encoding for each partition via, e.g., a user interface. For automatic partitioning (performed by EncodeStateGraph( ) discussed above), a minimum width binary code state encoding algorithm is preferably used.

The above-described principles of the described embodiment of the present invention will now be further explicated through a specific example.

Figure 7:
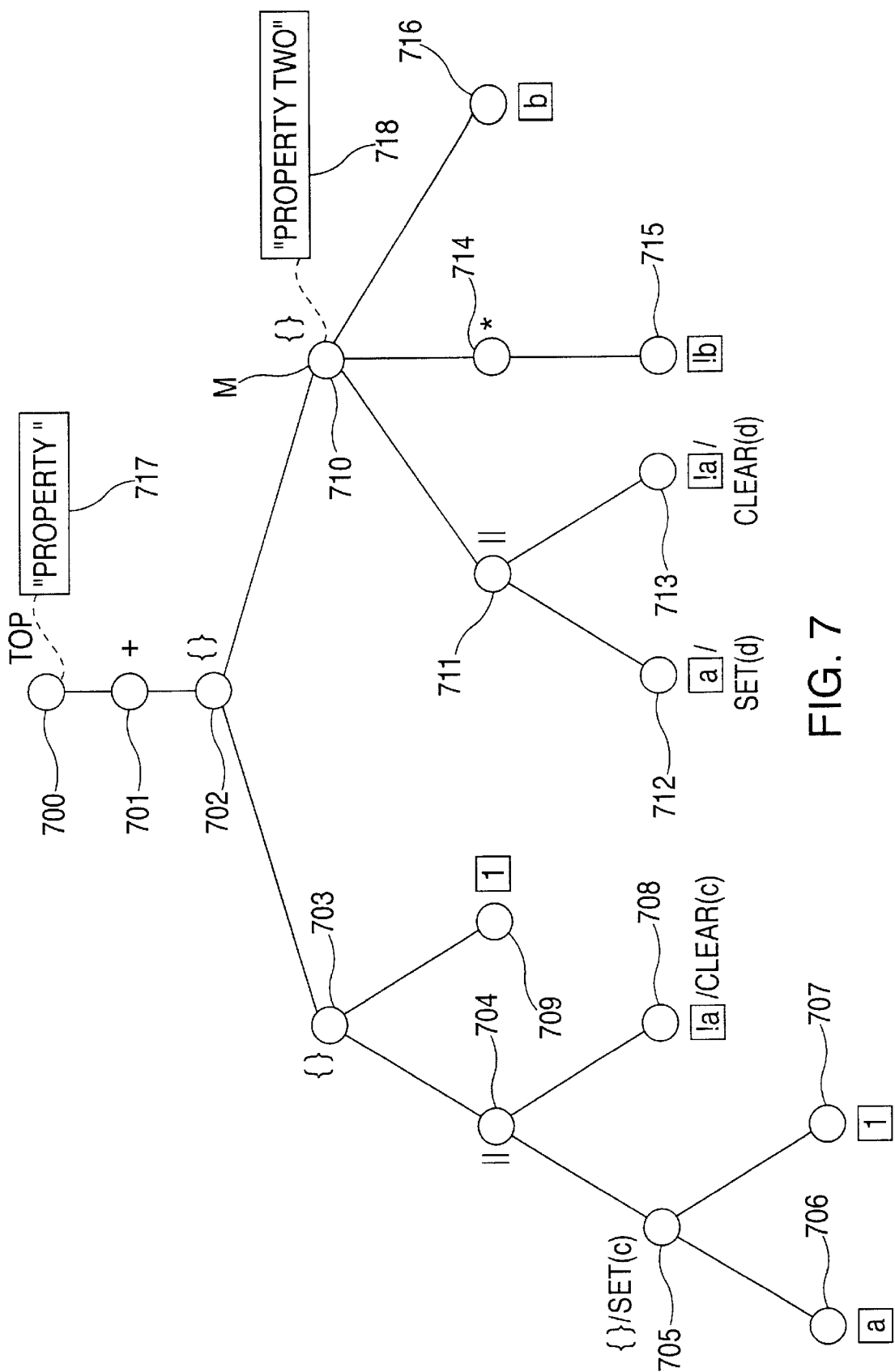
FIG. 7 depicts an example of a hierarchical high-level input description, to which the present invention may be applied.

FIG. 7 depicts a hierarchical high-level input description according to the Protocol Compiler software tool (also known as Dali) available from Synopsys, Inc. of Mountain View, Calif. The details of the Protocol Compiler, and its input language, are described in *A System for Compiling and Debugging Structured Data Processing Controllers*, by A. Seawright et al., EuroDAC '96, Geneva, Switzerland, pps. 86–91, which is herein incorporated by reference, and U.S. Patent Application entitled *A System for Frame-Based Protocol Graphical Capture, Synthesis. Analysis and Simulation*, Ser. No. 08/529,876, now U.S Pat. No. 5,920, 711, filed Sep. 18, 1995, to A. Seawright et al., which is herein incorporated by reference. It should be understood that any appropriate translation mechanism can be used with the present invention without departing from the spirit and scope of the invention.

An overview of the FSM described by FIG. 7 is as follows. Each leaf node (nodes 706–709, 712–713 and 715–716) represents the recognition of an input of the FSM being of a certain value upon the execution of an FSM cycle. The input recognized by the leaf node is in a box. The non-leaf nodes (with the exception of top node 700) have operators which indicate when, and with what repetition, inputs can be recognized. The "+" operator on a node (node 701 in the example) indicates that the combination of inputs represented by the subtree below the "+" node must be recognized one or more times before the "+" node itself accepts. The "{ }" operator on a node (for example node 702) indicates that its children must accept in sequence (from left to right) before the "{ }" node itself accepts. The "| |" operator on a node (for example node 704) indicates that the "| |" node itself accepts as soon as any one of its children accepts. The "*" operator on a node (node 714 in the example) indicates that the combination of inputs represented by the subtree below the "*" node must be recognized zero or more times before the "*" node itself accepts. Certain nodes have a "/" symbol following either the input to be recognized (on a leaf node such as node 708) or the operator of a non-leaf node (such as node 705). An action, specified on the right side of the "/," denotes an output to be generated by the FSM when its node accepts.

The sequence of inputs accepted by the subtree represented by node 703 is as follows (according to a bottom-up description). The "a" upon node 706 indicates that node 706 accepts when an input "a" to the FSM is true. The "1" upon node 707 indicates that node 707 is always "true" and therefore accepts upon any input. The "{ }" upon node 705 indicates that node 705 accepts when its two children accept, in sequence, from left to right. Therefore node 705 accepts when a first cycle to the FSM has input "a" true and a second immediately successive cycle of the FSM occurs (with any input). Upon accepting, node 705 sets output "c" of the FSM to true. The "!a" upon node 708 indicates that node 708 accepts when an input "a" to the FSM is false. Upon accepting, node 708 sets output "c" of the FSM to false. The "| |" upon node 704 indicates that node 704 accepts when either of its two children accept. Therefore, node 704 accepts when either (i) input "a" is set true upon a first cycle and then a second cycle occurs, or (ii) input "a" is set false upon a first cycle. The "1" upon node 709, like node 707, accepts upon any input. The "{ }" upon node 703 indicates acceptance upon a left to right sequence of acceptance of its children. Therefore, node 703 accepts when node 704 accepts first followed by another cycle occurring to cause node 709 to accept.

The "{ }" upon node 702 indicates acceptance upon a left to right sequence of acceptance of its children nodes 703 and 710. The "+" upon node 701 indicates acceptance upon one or more acceptances of node 702. Node 700 anchors the hierarchical description and accepts whenever any of its children (in this case node 701) accepts. Node 700 also has a property 717 attached. Property 717, as discussed above, is a designer-asserted property of the high-level input description. As discussed above, property 717 can indicate whether the circuit described by FIG. 7 is pipelined. Each subtree of the hierarchical high-level description can also have a property, as exemplified by property 718 attached to node 710 of FIG. 7.

It should be clear that any sequence of inputs causing subtree 703 to accept must follow, sequentially, any sequence of inputs causing subtree 710 to accept.

The sequence of inputs accepted by subtree 710 are as follows. Node 712 accepts when input "a" to the FSM is set true and upon acceptance sets output "d" to true. Node 713 accepts when input "a" to the FSM is set to false and upon acceptance sets output "d" to false. Node 711 accepts when either node 712 or node 713 accepts. Node 715 accepts when input "b" to the FSM is set to false. Node 714 accepts upon zero or more acceptances of node 715. Node 716 accepts when input "b" to the FSM is set to true. Node 710 accepts upon the left to right sequence of node 711 accepting, node 714 accepting and node 716 accepting.

Figure 8:
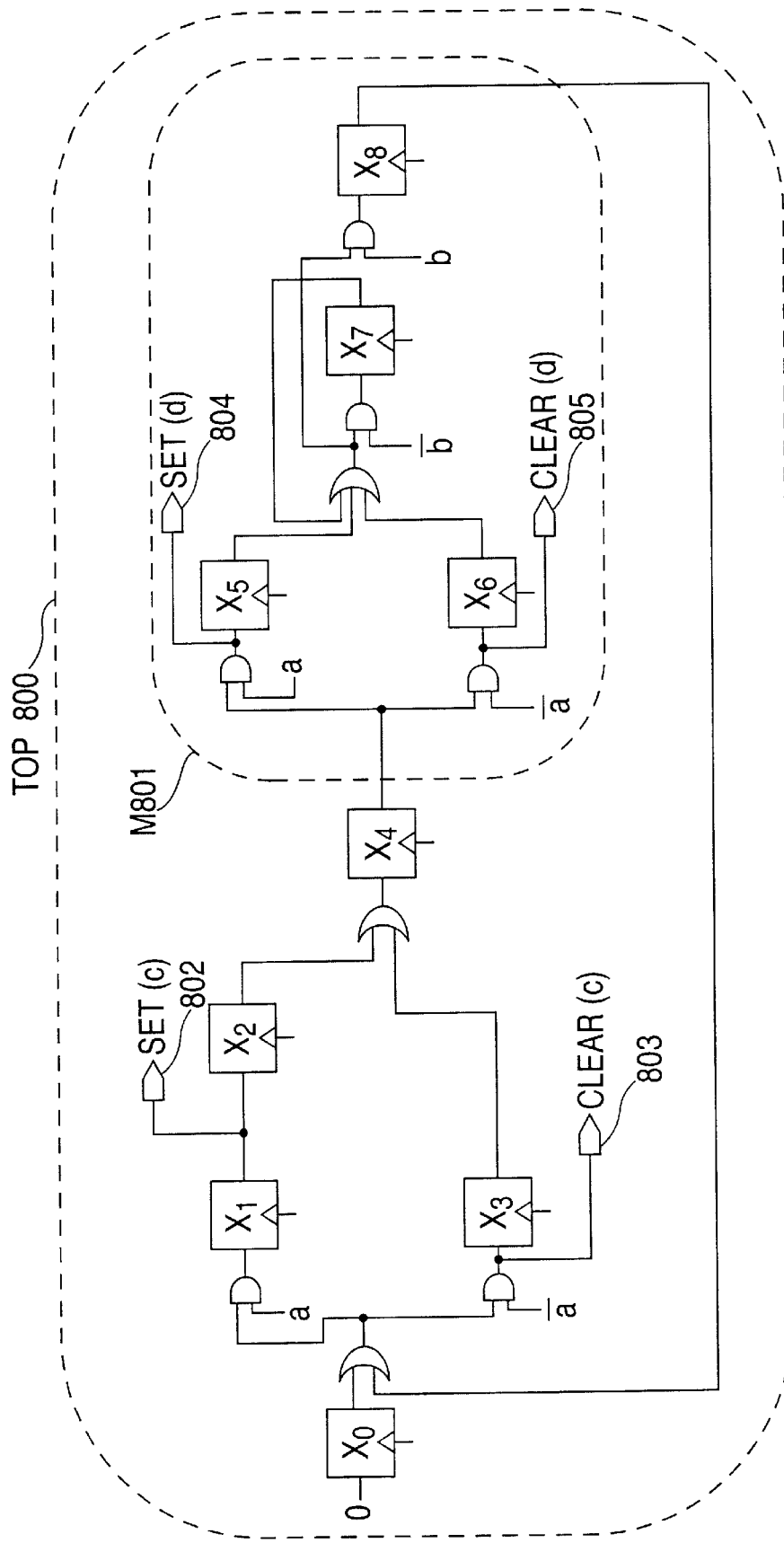
FIG. 8 depicts an unoptimized translation of the high-level description of FIG. 7 into an FSM circuit.

FIG. 8 depicts an unoptimized translation of FIG. 7 after translation to an FSM circuit. Partition 801 of FIG. 8 corresponds to subtree 710 of FIG. 7.

Partition 801 has been selected to illustrate: i) how correspondence between the high-level description and its FSM circuit is maintained, and ii) how a partition is optimized in accordance with the present invention. Partition 801 has not been selected in accordance with those aspects of the present invention relating to choosing a partition based upon the circuit's reachability function.

Figure 10:
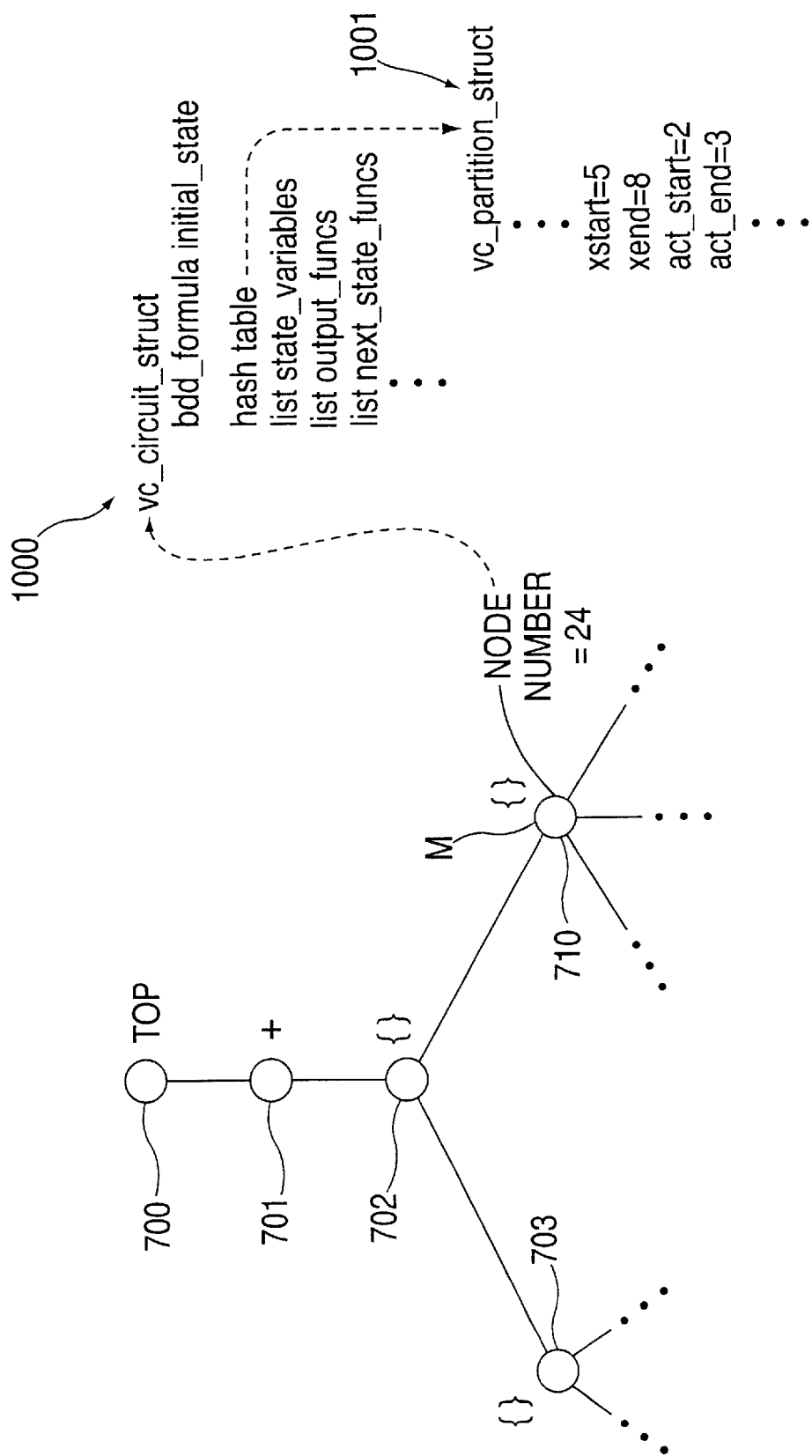
FIG. 10 shows how the correspondence between the high-level input description of FIG. 7 and the FSM circuit of FIG. 8 is maintained in the Synopsys Protocol Compiler software product.

Correspondence between the high-level description of FIG. 7 and the FSM circuit of FIG. 8 is maintained as follows in the Synopsys Protocol Compiler (FIG. 10). Each node of the high-level description has a unique node number. For example, node 710 (representing the partition for sub-circuit M) may have a node number of 24 (as shown in FIG. 10). FIG. 10 only depicts a fragment of the high-level tree of FIG. 7. The FSM circuit (also known as a virtual circuit in the Protocol Compiler) is represented by a data structure vc_circuit_struct in the C Programming Language. For example, virtual circuit 800 is represented by vc_circuit_struct 1000 of FIG. 10. The vc_circuit_struct comprises a BDD formula representing the initial state as well as lists of BDDs representing the state variables, next state functions, and output functions. More importantly, the vc_circuit_struct also comprises a hash table which is indexed with a node number to arrive at the node's unique partition definition vc_partition_struct (also in the C Programming Language). As shown in FIG. 10, node number 24 is used to index the hash table of vc_circuit_struct 1000 in order to locate vc_partition_struct 1001 which represents partition 801 of FIG. 8. vc_partition_struct's representation of a partition comprises four integers: xstart, xend, act_start, and act_end. xstart and xend represent the state variables of the partition, while act_start and act_end represent the outputs of the partition which are primary outputs (also known as actions) of the FSM. xstart and xend and act_start and act_end represent two contiguous ranges since it is an artifact of the Protocol Compiler that the state variables and action variables of any partition can each be identified by contiguous sequential ranges (the particular values shown for xstart, xend, act_start and act_end of vc_partition_struct 1001 are discussed below). Once the state and action variables are known, the functions driving these variables can be determined to produce a complete partition of the FSM circuit.

More generally, the essential information necessary to maintain correspondence between nodes of a high-level description and partitions of an FSM circuit, where the FSM circuit is represented by gates and registers, is as follows. Upon a bottom-up traversal of the high-level description, each node may add additional register bits or gates to the translated FSM circuit. Store with each node the identities of the register bits and/or gates which the node adds.

More generally, the essential information necessary to maintain correspondence between nodes of a high-level description and partitions of an FSM circuit, where the FSM circuit is represented by next state functions and action functions, is as follows. Upon a bottom-up traversal of the high-level description, each node may add additional state or action functions to the translated FSM circuit. Store with each node the identities of the state and/or action functions which the node adds.

In operation, Protocol Compiler uses the vc_circuit_struct as follows. One unoptimized vc_circuit_struct, representing the complete translated circuit, is kept unchanged. A copy of the unoptimized vc_circuit_struct is made for optimization purposes. Partitions of the optimization vc_circuit_struct are each "cut out" of the vc_circuit_struct and put temporarily in its own vc_circuit_struct. The temporary vc_circuit_struct is then optimized and "pasted" back into the optimization vc_circuit_struct. Part of the process of optimizing the temporary vc_circuit_struct involves translating the vc_circuit_struct into a state diagram. The process for producing the pruning relations for generating the state diagram is discussed below with respect to the specific example of FIG. 7.

FIG. 9A depicts a virtual circuit representation of the FSM circuit of FIG. 8 in accordance with the Protocol Compiler. Note that Y0–Y3 of FIG. 9A correspond to set(c), clear(c), set(d), clear(d) of FIG. 8. In accordance with the above discussion of the Protocol Compiler, partition 801 is represented in FIG. 10 by variables (xstart,xend) being of values (5, 8) and variables (act_start, act_end) being of values (2, 3). In FIG. 9A, these values of variables (xstart,xend) represent state variables X5 to X8 and variables (act_start, act_end) represent action variables Y2 to Y3.

In order to produce the pruning relations for partition 801, the reachability function R(X) of FSM circuit 800 must be determined. R(X) of FSM circuit 800 is shown in FIG. 9B. The state variables (X0,X1,X2,X3,X4) not in partition M are existentially quantified out of R(X) to produce the reachability function $R_M(X)$ just for the partition 801. $R_M(X)$, depicted in FIG. 9B, is used in pruning out unreachable states of the sub-circuit M (also known as partition 801) in generating the state graph for partition 801.

The relation for pruning out invalid transitions of sub-circuit M, $T_M(X_M, I_M)$, is derived as follows (according to the general procedure presented above).

First, k=1 since there is only one $I_{Top/M}$ input to partition 801. The individual input to partition 801 is referred to as $i_1$ and the function driving $i_1$, in terms of state variables and primary inputs, is referred to as $f_1(X, I)$. $f_1(X, I)$ is depicted in FIG. 9B.

Second, $f_1(X, I)$ is exclusively NORed with $i_1$, as shown in FIG. 9B.

Third, the results of the exclusive NORs are all ANDed together which produces the same function in the case of FIG. 9B since there is only one $I_{Top/M}$ input.

Fourth, the result of the AND is itself ANDed with R(X) to produce the transition pruning relation $T(X, I_M)$ as shown in FIG. 9B. The full specification of $T(X, I_M)$ is illustrated in FIG. 9C.

Fifth, since we don't care about the state variables not in sub-circuit M (namely X0–X4), we existentially quantify them out to produce the pruning relation $T_M(X_M, I_M)$ as shown in FIG. 9C.

Figure 11A:
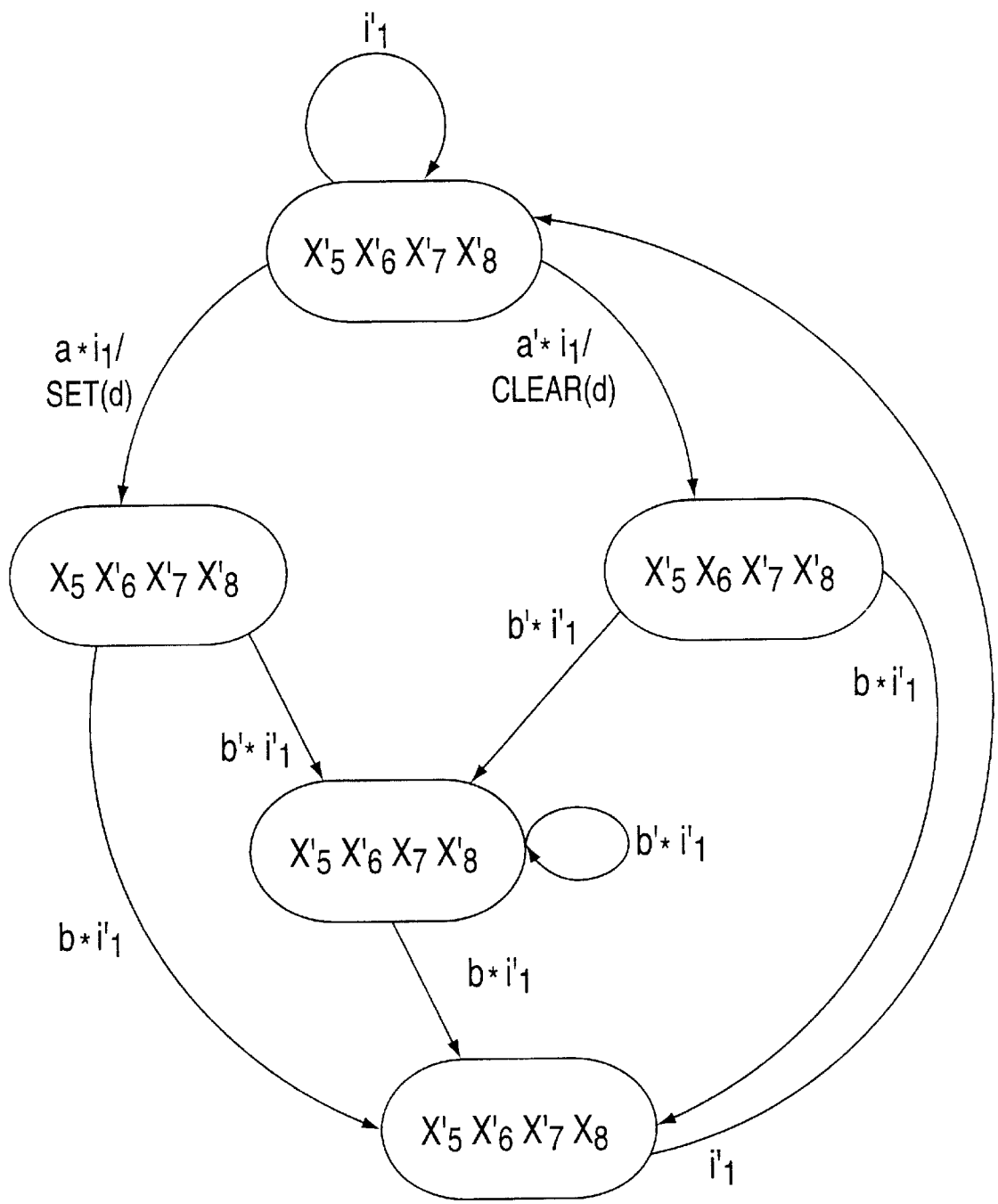
Figure 12A:
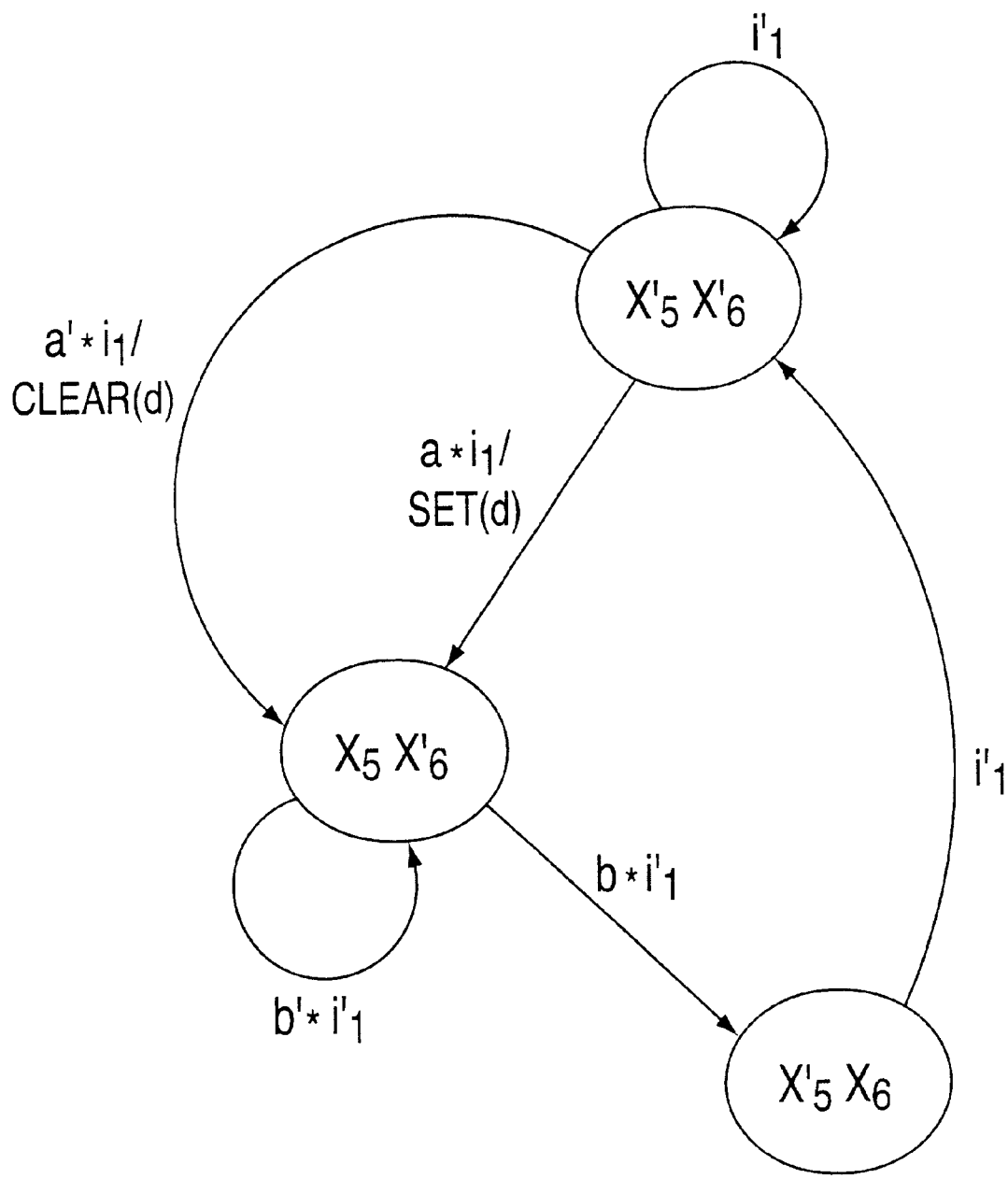

Starting from the initial state of X5–X8 being zero (as indicated by FIG. 9A) the state graph of sub-circuit M 801 can be generated, with the resulting state graph shown in FIG. 11A. FIG. 11A is generated with invalid states and transitions pruned by functions $R_M(X_M)$ of FIG. 9B and $T_M(X_M, I_M)$ of FIG. 9C. Thus, while the four bits of M are capable of representing 16 states, FIG. 11A has only the five states permitted by $R_M(X_M)$. Furthermore, $T_M(X_M, I_M)$ requires the transitions out of every state, except for the initial state, have the $i_1$ input being false. FIG. 12A shows a minimization of the state graph of FIG. 11A. In accordance with the overall process of FIG. 4, the minimized state graph would then be converted back into an FSM circuit (StateGraphToCircuit( )) and then "pasted" back into vc_circuit_struct 1000 representing circuit 800 (by MergeBackSubCircuit( )).

Figure 11B:
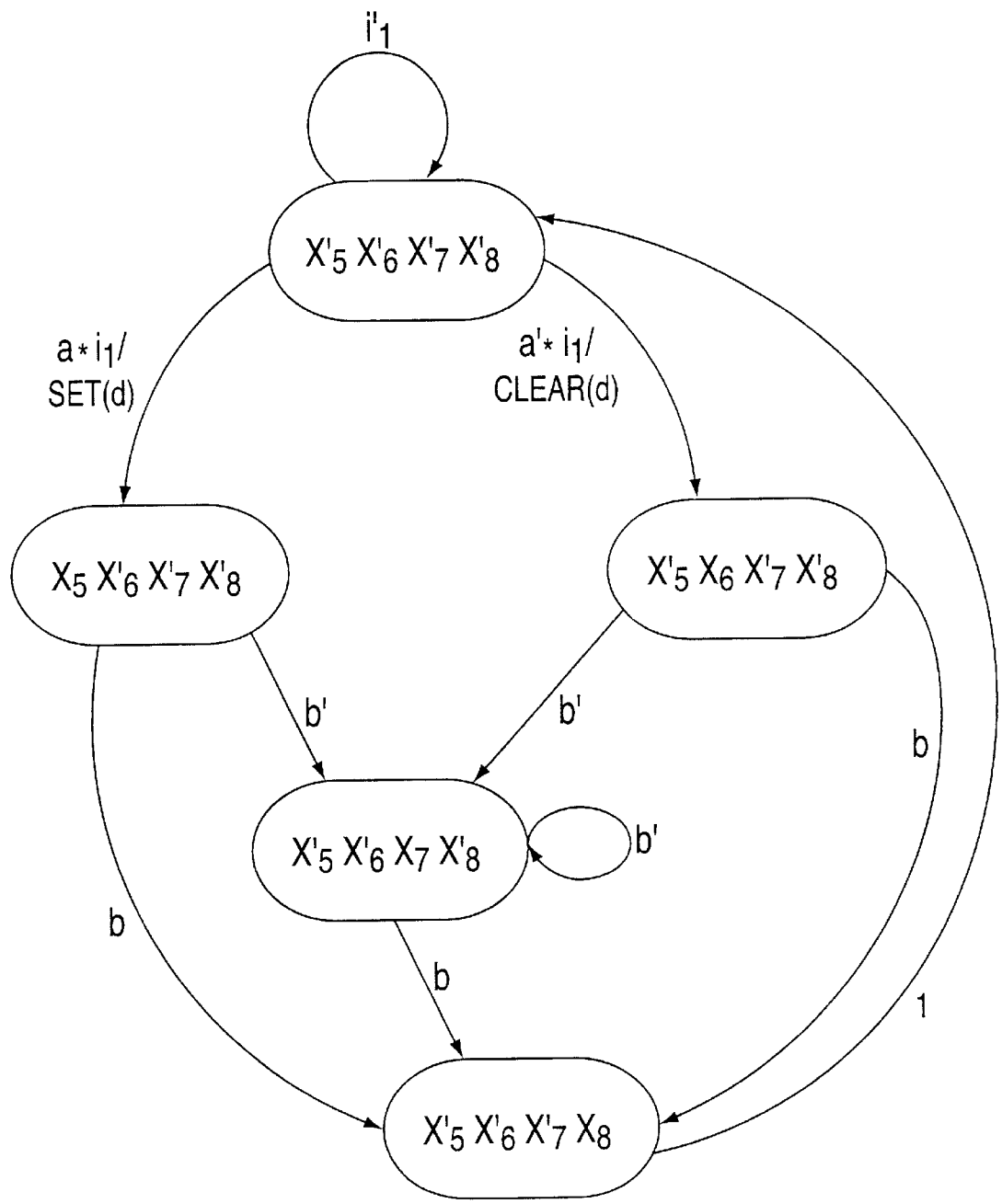
FIG. 11B depicts a pruned, transition simplified but unoptimized state graph of a sub-circuit of FIG. 8 produced in accordance with the present invention.
Figure 12B:
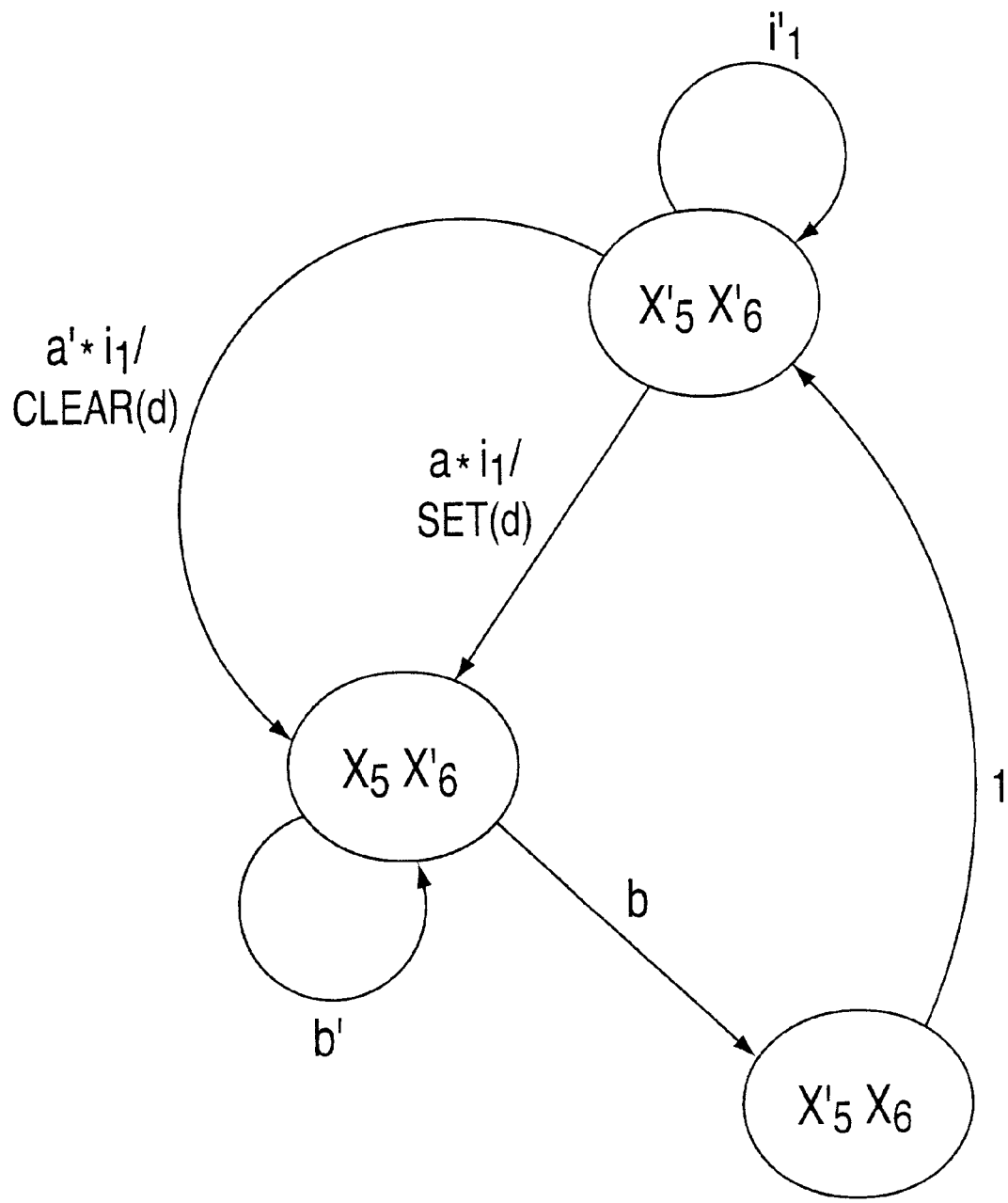
FIG. 12B depicts an optimization of the state graph of FIG. 11B.

If transition simplification were also used, following the generation and pruning of the state graph of sub-circuit M 801, then FIG. 11A is further simplified into FIG. 11B. FIG. 12B shows the result minimizing FIG. 11B when performed in the same manner in which FIG. 11A was minimized into FIG. 12A.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method performed in a circuit synthesis process, comprising the steps performed by a data processing system of:
   scanning at least one node of a hierarchical description of a finite state machine stored in a memory of the data processing system;
   assigning, for each node of the hierarchical description scanned, a metric determined from a reachability function of the finite state machine; and
   selecting, according to the metric, certain nodes of the hierarchical description as defining a partition of the finite state machine for optimization.

2. The method of claim 1, wherein the step of selecting selects nodes of the hierarchical description according to the metric with a greedy heuristic.

3. The method of claim 1, wherein the step of assigning includes a step of determining, for each node scanned, a corresponding sub-finite state machine of the finite state machine.

4. The method of claim 3, wherein the step of assigning further includes predicting, as part of the metric for each node scanned, a number of states of the corresponding sub-finite state machine.

5. The method of claim 4, wherein the step of assigning further includes, as part of the metric for at least one node scanned, optimizing, for at least the one node scanned, the corresponding sub-finite state machine to determine an actual number of states of the corresponding sub-finite state machine.

6. The method of claim 5, wherein the step of optimizing is only performed for those scanned nodes whose predicted number of states is less than a threshold.

7. The method of claim 5, wherein the step of selecting selects at least one node according to the predicted and actual number of states.

8. The method of claim 3, wherein the step of assigning further includes determining, as part of the metric for each node scanned, a number of state variables of the corresponding sub-finite state machine.

9. The method of claim 3, wherein the step of assigning further includes, as part of the metric for each node scanned, optimizing, for each node scanned, the corresponding sub-finite state machine to determine an actual number of states of the corresponding sub-finite state machine.

10. The method of claim 3, wherein the step of assigning further includes:
    predicting, for each node scanned, a number of states of the corresponding sub-finite state machine;
    determining, for each node scanned, a number of state variables of the corresponding sub-finite state machine; and
    determining, as part of the metric for each node scanned, a coding efficiency metric based upon the number of states and the number of state variables of the corresponding sub-finite state machine.

11. The method of claim 1, further comprising the step of selecting, according to input received from a user, at least one node of the hierarchical description as defining a partition of the finite state machine for optimization.

12. The method of claim 1, further comprising the step of generating at least one sub-finite state machine of the finite state machine corresponding to one of the nodes selected according to the metric.

13. The method of claim 12, further comprising the steps of:
    generating at least one state of a state graph from the sub-finite state machine; and
    determining whether the state is valid from the reachability function of the finite state machine.

14. The method of claim 12, further comprising the steps of:
    generating at least one transition of a state graph from the sub-finite state machine; and
    determining whether the transition is valid from the reachability function of the finite state machine.

15. The method of claim 12, further comprising the steps of:
    assigning a property to the hierarchical description of the finite state machine;
    generating at least one state of a state graph from the sub-finite state machine; and
    determining whether the state is valid from the property of the hierarchical description of the finite state machine.

16. The method of claim 12, further comprising the steps of:
    assigning a property to the hierarchical description of the finite state machine;
    generating at least one transition of a state graph from the sub-finite state machine; and
    determining whether the transition is valid from the property of the hierarchical description of the finite state machine.

17. The method of claim 1, further comprising the step of selecting, according to input received from a user, at least one node of the hierarchical description as defining a partition of the finite state machine not to be chosen for optimization.

18. A data processing system for circuit synthesis, comprising:
    a circuit configured to scan at least one node of a hierarchical description of a finite state machine stored in a memory of the data processing system;
    a circuit configured to assign, for each node of the hierarchical description scanned, a metric determined from a reachability function of the finite state machine; and
    a circuit configured to select, according to the metric, certain nodes of the hierarchical description as defining a partition of the finite state machine for optimization.

19. A computer program product including:
    a computer usable medium having computer readable code embodied therein for causing circuit synthesis, the computer program product comprising:
    computer readable program code devices configured to cause a computer to effect scanning at least one node of a hierarchical description of a finite state machine stored in a memory of a data processing system;
    computer readable program code devices configured to cause a computer to effect assigning, for each node of the hierarchical description scanned, a metric determined from a reachability function of the finite state machine; and
    computer readable program code devices configured to cause a computer to effect selecting, according to the metric, certain nodes of the hierarchical description as defining a partition of the finite state machine for optimization.

* * * * *